(12) United States Patent
Nakata et al.

(10) Patent No.: US 7,145,717 B2
(45) Date of Patent: Dec. 5, 2006

(54) OPTICAL AMPLIFIER

(75) Inventors: Masao Nakata, Kawasaki (JP); Kosuke Komaki, Kawasaki (JP); Yoshio Shimano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/793,273

(22) Filed: Mar. 5, 2004

(65) Prior Publication Data
US 2004/0174586 A1 Sep. 9, 2004

(30) Foreign Application Priority Data
Mar. 5, 2003 (JP) ............... 2003-057951

(51) Int. Cl.
*H04B 10/12* (2006.01)
(52) U.S. Cl. .................................. 359/341.41
(58) Field of Classification Search ........... 359/341.41, 359/341.43
See application file for complete search history.

(56) References Cited

U.S. PATENT DOCUMENTS

| | | | |
|---|---|---|---|
| 5,374,973 A * | 12/1994 | Maxham et al. ......... | 359/341.4 |
| 5,594,748 A * | 1/1997 | Jabr ........................ | 372/38.09 |
| 6,215,565 B1 * | 4/2001 | Davis et al. ............... | 398/27 |
| 6,246,514 B1 | 6/2001 | Bonnedal et al. | |
| 6,341,034 B1 | 1/2002 | Sun et al. | |
| 6,417,965 B1 * | 7/2002 | Ye et al. ................. | 359/341.41 |
| 6,690,508 B1 * | 2/2004 | Tian et al. ............... | 359/341.4 |
| 6,762,878 B1 * | 7/2004 | Park et al. ............. | 359/341.42 |
| 6,900,934 B1 * | 5/2005 | Lelic ...................... | 359/341.41 |
| 2002/0027706 A1 * | 3/2002 | Park et al. ............. | 359/341.41 |
| 2003/0184851 A1 * | 10/2003 | Tian et al. ............... | 359/341.4 |

OTHER PUBLICATIONS

Meriam-Webster's Collegiate Dictionary, 10th ed., Meriam-Webster Inc, Springfiled, Mass., p. 79 (1999).*
Patent Abstracts of Japan, Pub. No. 2002-217836.
European Patent Office Search Report dated Jun. 29, 2005 in corresponding European Patent Application No. EP 04 00 4302.

* cited by examiner

*Primary Examiner*—Jack Keith
*Assistant Examiner*—Eric Bolda
(74) *Attorney, Agent, or Firm*—Staas & Halsey LLP

(57) ABSTRACT

An optical amplifier that improves transmission quality by driving an excitation light source according to a change in the level of an input optical signal and by compensating for a change in the characteristics of the excitation light source. An optical amplification section includes an amplification medium doped with an active substance for optical amplification and an excitation light source for emitting excitation light. A constant-gain control section finds out target excitation light power to be set according to a change in the level of an input optical signal on the basis of a correlation between a gain and excitation light power to obtain a target gain, finds out a target drive signal for making the excitation light source emit the target excitation light power on the basis of a correlation between a drive signal for driving the excitation light source and excitation light power, and exercises constant-gain control over the optical amplification section by a feedforward control system.

6 Claims, 11 Drawing Sheets

OPTICAL AMPLIFIER

BACKGROUND OF THE INVENTION (1) Field of the Invention

This invention relates to an optical amplifier and, more particularly, to an optical amplifier for amplifying a wavelength division multiplexing (WDM) optical signal.

(2) Description of the Related Art

In recent years WDM communication in which a plurality of optical signals with different wavelengths are multiplexed into a single optical fiber has occupied attention and been put to practical use. One of the important devices used in WDM systems is the erbium-doped fiber amplifier (EDFA).

The EDFA is an optical amplifier in which an erbium-doped fiber (EDF) is used as an amplification medium. With the EDFA, excitation light emitted from an excitation light source (semiconductor laser) is inputted to the fiber through which an optical signal is traveling, and the level of the optical signal is amplified by a stimulated emission which occurs at that time.

By the way, the excitation light source will emit desired excitation light when a drive signal is provided thereto. However, the characteristics of the excitation light source will change due to, for example, degradation with the passage of time, so the correlation between a drive signal and excitation light power will change. For example, though a drive signal d1 was provided for making the excitation light source output excitation light power p1, a drive signal d2 (d1<d2) is required for obtaining the excitation light power p1 because of a change in the characteristics of the excitation light source caused by degradation with the passage of time. Therefore, to control the driving of the excitation light source, a drive signal according to a change in the characteristics of the excitation light source must always be provided.

Conventionally, to control the driving of an excitation light source, a technique in which compensation for the temperature and degradation of the excitation light source is made by comparing excitation light at operation time with excitation light, which is emitted when the excitation light source is driven on the basis of data for making it output desired excitation light at ambient temperature and which is treated as a reference value, has been proposed (see, for example, Japanese Unexamined Patent Publication No. 2002-217836, paragraph nos. [0017]–[0033] and FIG. 1).

With the above conventional technique, however, the degree of actual degradation of the excitation light source is not recognized and a change in input optical signals is not taken into consideration at all. Accordingly, the accuracy of the degradation compensation is low and system environments to which the conventional technique is applicable are limited.

FIG. 11 is a block diagram showing the rough structure of a conventional apparatus. A conventional apparatus 100 comprises a temperature sensor 101, data storage sections 102 and 105, an excitation control section 103, a light receiving element 104, a differential amplifier 106, and a CPU 107.

The data storage section 102 stores data (which is regularly rewritten by the CPU 107) for making the excitation control section 103 output given excitation light at a predetermined temperature. When the temperature sensor 101 detects ambient temperature, the data storage section 102 outputs data corresponding to the result of the detection. The excitation control section 103 outputs excitation light on the basis of the data it receives. The light receiving element 104 converts the excitation light into an electrical signal. The data storage section 105 stores photocurrent which flows at that time as data.

The excitation control section 103 first outputs excitation light on the basis of the data sent from the data storage section 102. The difference between the photocurrent which flows at that time and photocurrent stored in the data storage section 105 is provided to the excitation control section 103 via the differential amplifier 106. The excitation control section 103 adjusts the excitation light it outputs so as to eliminate this difference.

The conventional apparatus 100 performs not only temperature compensation but also degradation compensation by updating data with the CPU 107. However, this data update is not performed by detecting the actual state of the degradation of the excitation light source. Therefore, it will be difficult to update data by the CPU 107 at the time when the correlation between a drive signal and excitation light power begins to change. In addition, even if excitation light sources of the same type are used in a plurality of units, the state of degradation will differ among these units. Accordingly, it is impossible to accurately perform degradation compensation on the basis of data uniformly set for each unit. That is to say, it is virtually difficult for the conventional apparatus 100 to perform compensation for the degradation of the excitation light source.

Moreover, if a WDM optical signal is inputted and the number of different wavelengths contained in it changes, excitation light power corresponding to the number of wavelengths after the change must be outputted to curb the bad influence of a change in gain and a transient response. (For example, if the number of different wavelengths contained in the WDM optical signal reduces from forty to ten, then excitation light power must be changed quickly from excitation light power $P_{40}$ corresponding to forty wavelengths to excitation light power $P_{10}$ corresponding to ten wavelengths.) With the conventional apparatus 100, however, such a change of an input optical signal is not taken into consideration. Accordingly, the conventional apparatus 100 cannot handle an optical signal, such as a WDM signal, the level of which changes according to a change in the number of wavelengths contained therein. As a result, environments to which the conventional apparatus 100 is applicable are limited.

SUMMARY OF THE INVENTION

The present invention was made under the background circumstances described above. An object of the present invention is to provide an optical amplifier in which an excitation light source is driven according to a change of input light and which improves transmission quality by compensating for a change in the characteristics of the excitation light source.

In order to achieve the above object, an optical amplifier for amplifying an optical signal is provided. This optical amplifier comprises an optical amplification section including an amplification medium doped with an active substance for optical amplification and an excitation light source which emits excitation light, for performing optical amplification and a constant-gain control section for finding out target excitation light power to be set according to a change in the level of an input optical signal on the basis of a correlation between a gain and excitation light power to obtain a target gain, for finding out a target drive signal for making the excitation light source emit the target excitation light power on the basis of a correlation between a drive signal for driving the excitation light source and excitation light power, and for exercising constant-gain control over the optical amplification section by a feedforward control system.

Furthermore, in order to achieve the above object, a gain control method for keeping a gain at which an optical signal is amplified constant is provided. This gain control method comprises the steps of recognizing a level of an input optical signal, obtaining target excitation light power for realizing a target gain on the basis of the recognized level, obtaining excitation light power by regularly sending drive signals for generating a correlation function indicative of a correlation between the drive signals and the excitation light power, generating a correlation function according to a change in characteristics of an excitation light source from the drive signals and the obtained excitation light power, finding out a target drive signal corresponding to the target excitation light power on the basis of the generated correlation function, and exercising constant-gain control with a feedforward control system by driving the excitation light source by the target drive signal.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Figure 1:
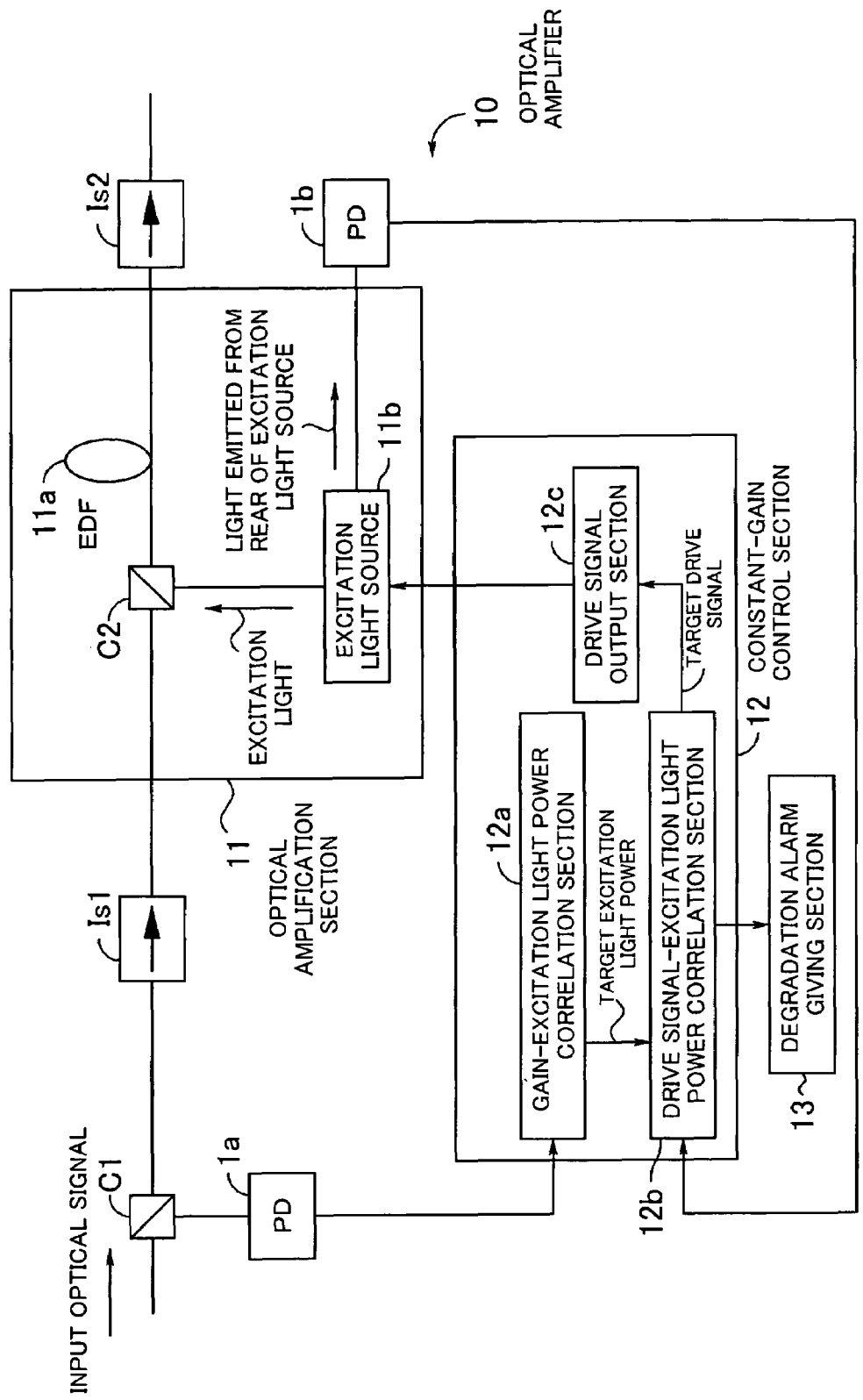
FIG. 1 is a view for describing the principles underlying an optical amplifier according to the present invention.

Embodiments of the present invention will now be described with reference to the drawings. FIG. 1 is a view for describing the principles underlying an optical amplifier according to the present invention. An optical amplifier 10 performs optical amplification of a WDM signal and comprises an optical amplification section 11, a constant-gain control section 12, a degradation alarm giving section 13, a demultiplexer C1, isolators Is1 and Is2, and photodiodes (PD) 1a and 1b.

The optical amplification section 11 includes an amplification medium (EDF) 11a doped with an active substance for optical amplification, an excitation light source 11b for emitting excitation light, and a multiplexer C2. The constant-gain control section 12 includes a gain-excitation light power correlation section 12a, a drive signal-excitation light power correlation section 12b, and a drive signal output section 12c.

The demultiplexer C1 drops an input optical signal in two directions. One is outputted to the isolator Is1 and the other is outputted to the PD 1a. The optical signal which flows to the isolator Is1 passes through it, is combined with excitation light by the multiplexer C2, is amplified by the EDF 11a, passes through the isolator Is2, and is outputted.

Light is propagated through each of the isolators Is1 and Is2 only in a direction indicated by an arrow in FIG. 1 and therefore is not propagated through each of them in the reverse direction. If reflected light in the optical fiber returns to the EDF 11a, noise will occur. The isolators Is1 and Is2 are located to prevent an S/N ratio from being degraded.

On the other hand, the optical signal which flows to the PD 1a is converted into photocurrent by the Pd 1a and is inputted to the constant-gain control section 12. The gain-excitation light power correlation section 12a receives the photocurrent and finds out target excitation light power to be set according to a change in the level of the input optical signal on the basis of a correlation between a gain and excitation light power. (If the input optical signal is a WDM signal, a change in the number of wavelengths contained in the input optical signal will lead to a change in its level. Accordingly, hereinafter a change in the level will also be referred to as a change in the number of the wavelengths.)

The drive signal-excitation light power correlation section 12b finds out a target drive signal for making the excitation light source 11b emit the target excitation light power on the basis of a correlation between a drive signal for driving the excitation light source 11b and excitation light power.

The drive signal-excitation light power correlation section 12b obtains a correlation function between a drive signal and excitation light power by varying the drive signal and regularly measuring the excitation light power. In this case, the PD 1b converts light emitted from the rear of the excitation light source 11b into photocurrent and the drive signal-excitation light power correlation section 12b finds out the excitation light power (power emitted from the rear of the excitation light source 11b) from this photocurrent. The drive signal-excitation light power correlation section 12b finds out the target drive signal from the target excitation light power on the basis of this correlation function (described later in FIG. 7).

The drive signal output section 12c performs automatic power control (APC) and outputs the target drive signal. In addition, the drive signal output section 12c outputs a drive signal which does not exceed an upper limit by performing an APC limitation process. The degradation alarm giving section 13 recognizes the degree of the degradation of the excitation light source 11b from the correlation slope of the correlation function and performs alarm giving control.

The constant-gain control section 12 performs constant-gain control with a feedforward type control system. That is to say, the constant-gain control section 12 performs not feedback control in which constant-gain control is performed on the basis of the differential between the input optical signal and an output optical signal (which is outputted from the EDF 11a after gain control) but feedforward control in which constant-gain control is performed directly on the basis of a change in the level of the input optical signal. The latter is stabler than the former (described later in FIG. 5).

A transient response phenomenon caused by a change in the number of wavelengths contained in a WDM signal will now be described. A transient response means a transient process which a response caused by an input provided to a control system passes through until it reaches a new steady state. If excitation light cannot be controlled quickly according to a change in the number of wavelengths contained in an input WDM signal (a change in the level of the input optical signal), an optical surge will appear. This optical surge may cause a transmission error.

Figure 2:
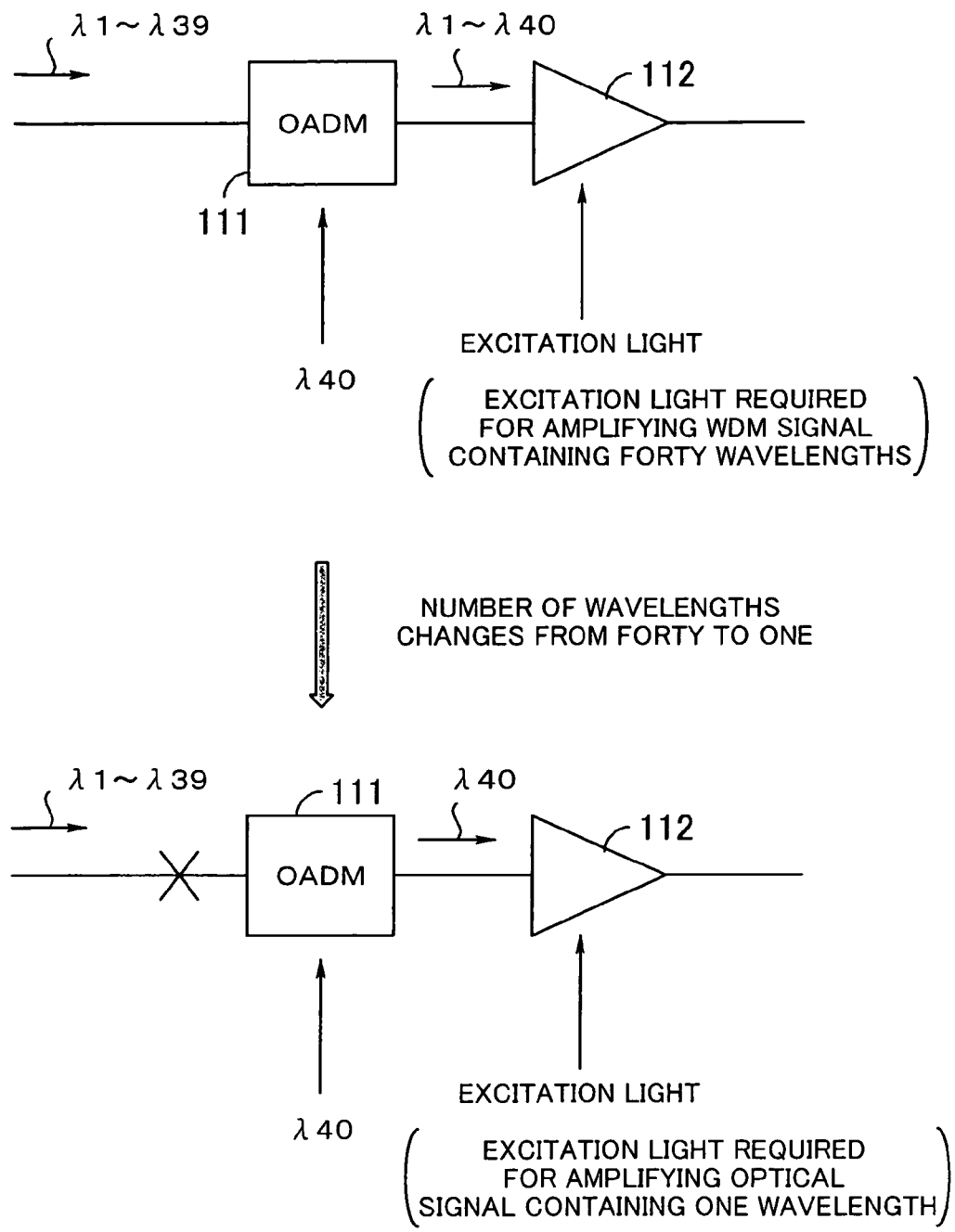
FIG. 2 shows a change in excitation light power caused by a change in the number of wavelengths contained in a WDM signal.

FIG. 2 shows a change in excitation light power caused by a change in the number of wavelengths contained in a WDM signal. An optical add drop multiplex (OADM) 111 adds a wavelength λ 40 to an optical signal containing, for example, thirty-nine wavelengths λ 1 through λ 39 and outputs the optical signal containing the forty wavelengths λ 1 through λ 40. Excitation light required for amplifying the WDM signal containing the forty wavelengths λ 1 through λ 40 is inputted to an optical amplifier 112 and the WDM signal containing the forty wavelengths λ 1 through λ 40 is amplified.

In this state of things it is assumed that the λ 1 through λ 39 optical signals are not sent due to, for example, a line failure. Even if the λ 1 through λ 39 optical signals are not inputted to the OADM 111, the λ 40 optical signal added must be sent. Accordingly, the power of the excitation light inputted to the optical amplifier 112 must be lowered immediately to handle one wavelength optical signal. Excitation light for handling one wavelength optical signal must be inputted to the optical amplifier 112 to amplify and output the λ 40 optical signal (that is to say, the power of excitation light inputted must be changed according to a change in the level of the input optical signal).

Figure 3:
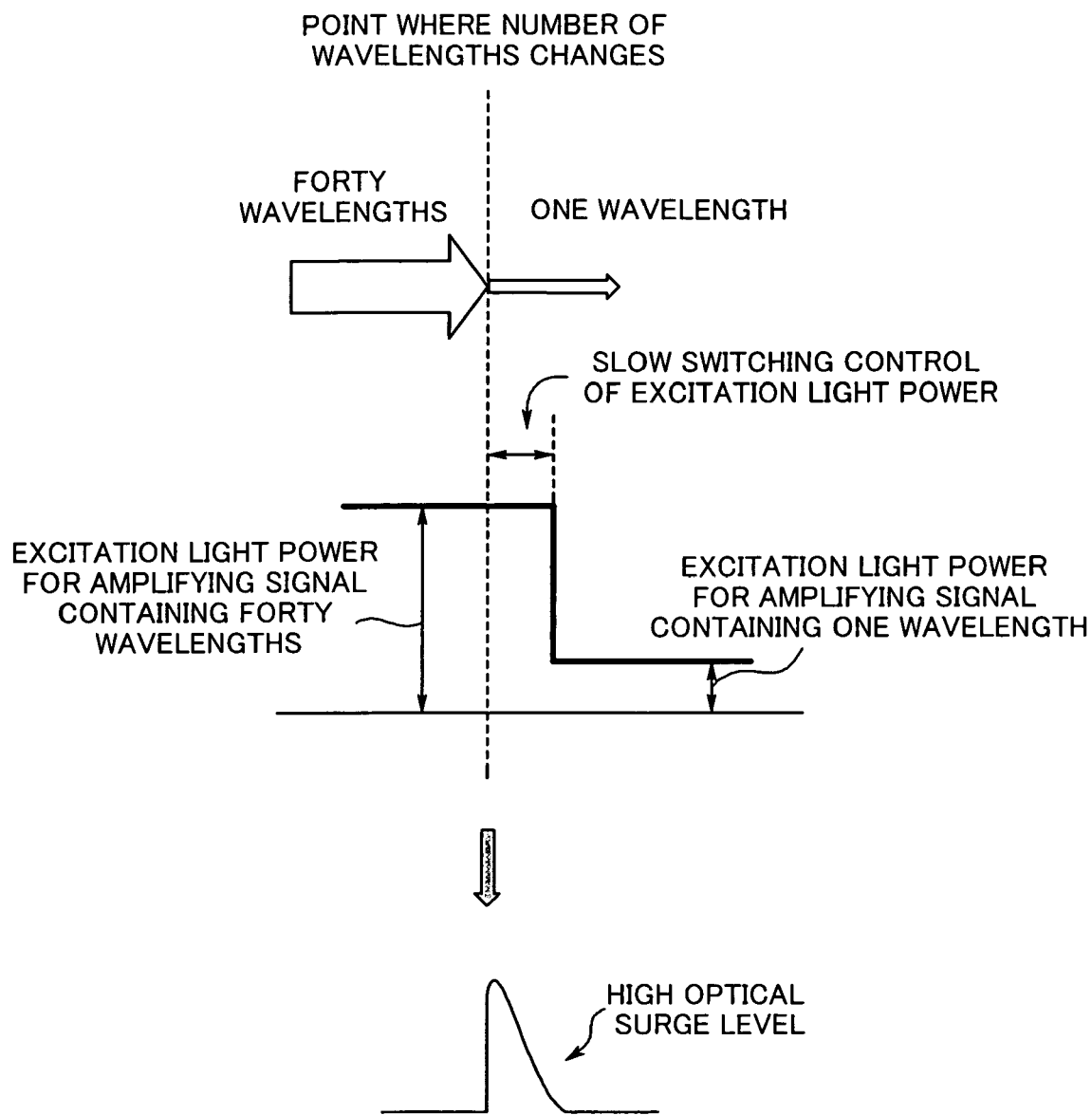
FIG. 3 shows an optical surge caused by a change in the number of wavelengths contained in a WDM signal.
Figure 4:
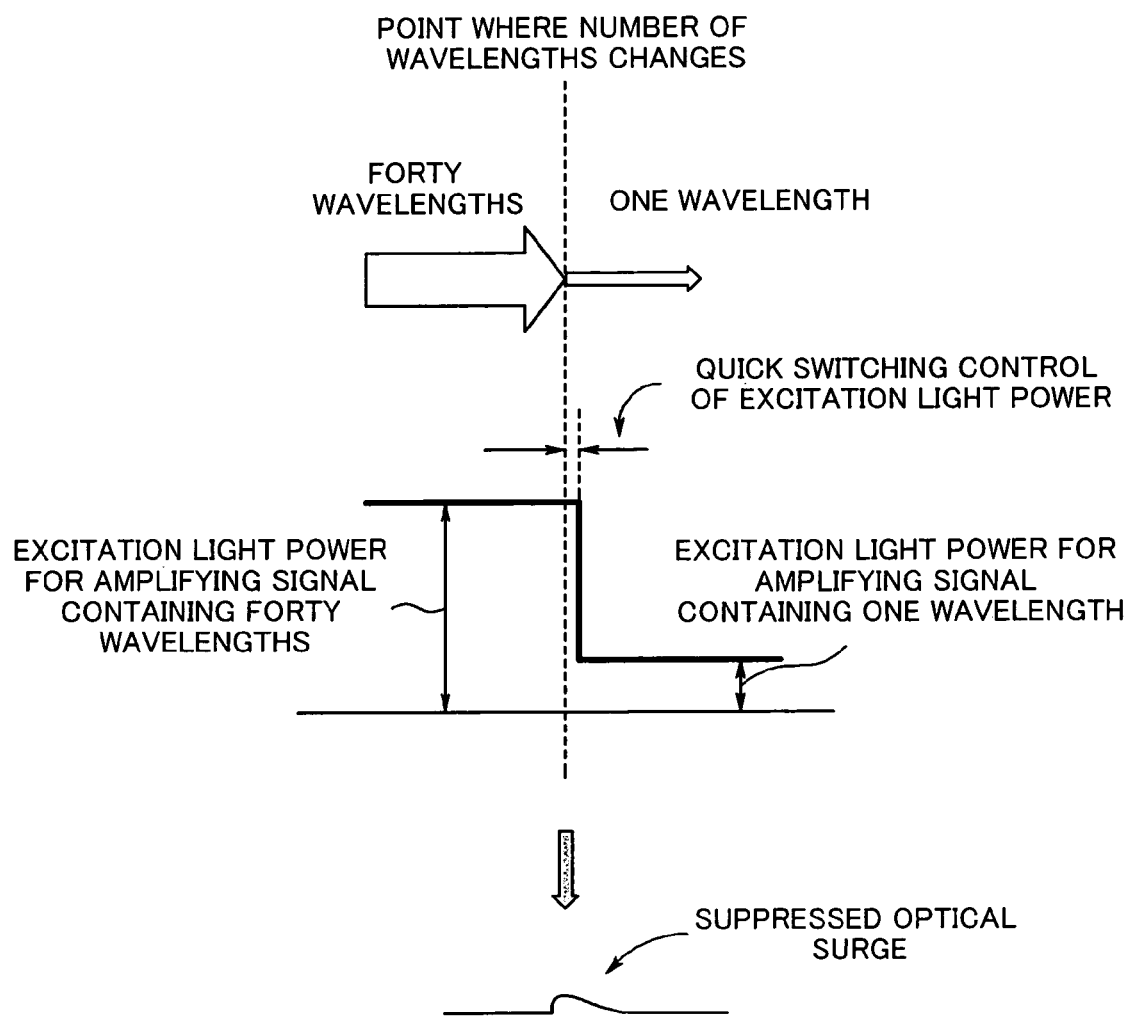
FIG. 4 shows an optical surge caused by a change in the number of wavelengths contained in a WDM signal.

FIGS. 3 and 4 show an optical surge caused by a change in the number of wavelengths contained in a WDM signal. As shown in FIG. 3, if switching control of excitation light power is performed slowly at the time when the number of the wavelengths changes, excitation light for handling forty wavelength optical signals is inputted to the optical amplifier 112 for a long period of time in spite of only one wavelength optical signal being inputted. As a result, there will be a rapid change in the gain by the optical amplifier 112 and residual light (optical surge) at a high level will be outputted instantaneously from the optical amplifier 112. If this optical surge is transmitted, a transmission error may occur. Moreover, if many optical amplifiers 112 are connected, this optical surge will be amplified cumulatively and may damage a receiver.

On the other hand, as shown in FIG. 4, if switching control of excitation light power is performed quickly, a period of time for which the excitation light for handling the forty wavelength optical signals is inputted to the optical amplifier 112 in spite of only one wavelength optical signal being inputted is short. This prevents a gain by the optical amplifier 112 from changing rapidly and therefore suppresses an optical surge. That is to say, if switching control of excitation light power is performed slowly at the time when the level of the input optical signal changes, transient response time will be long (gain change time is long) and an optical surge at a high level will appear. On the other hand, if switching control of excitation light power is performed quickly, transient response time will be short (gain change time is short) and an optical surge can be suppressed.

A control system for performing constant-gain control will now be described. An optical amplifier amplifies different wavelength signals contained in a WDM signal in block at a constant gain. By keeping a gain by an EDF constant in this way, a difference in gain for optical signals with different wavelengths caused by the wavelength characteristics of the EDF can be eliminated. Control systems for performing such constant-gain control come in two types: a feedback type and a feedforward type.

Figure 5A:
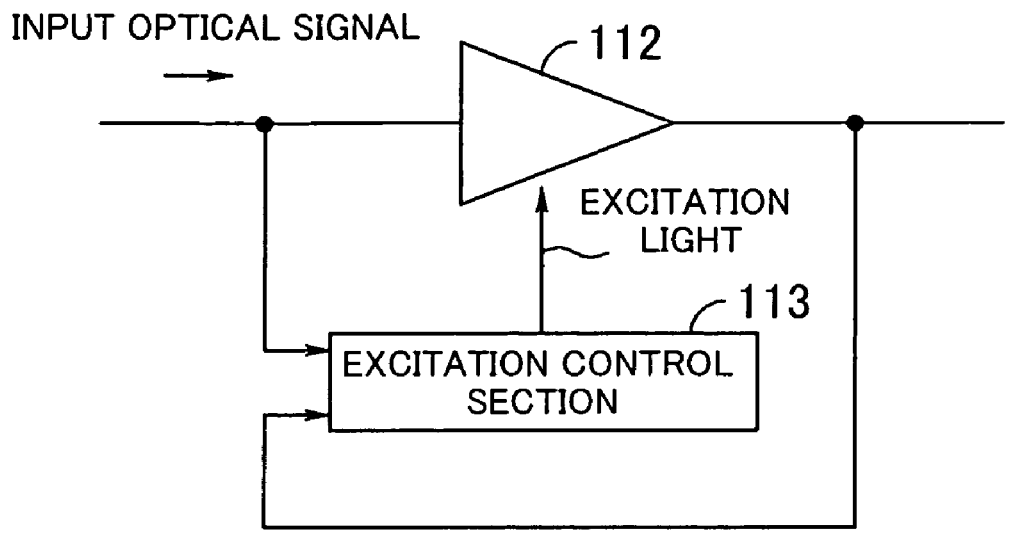
FIGS. 5A and 5B show feedback type and feedforward type control systems, FIG. 5A showing a feedback type control system, FIG. 5B showing a feedforward type control system.
Figure 5B:
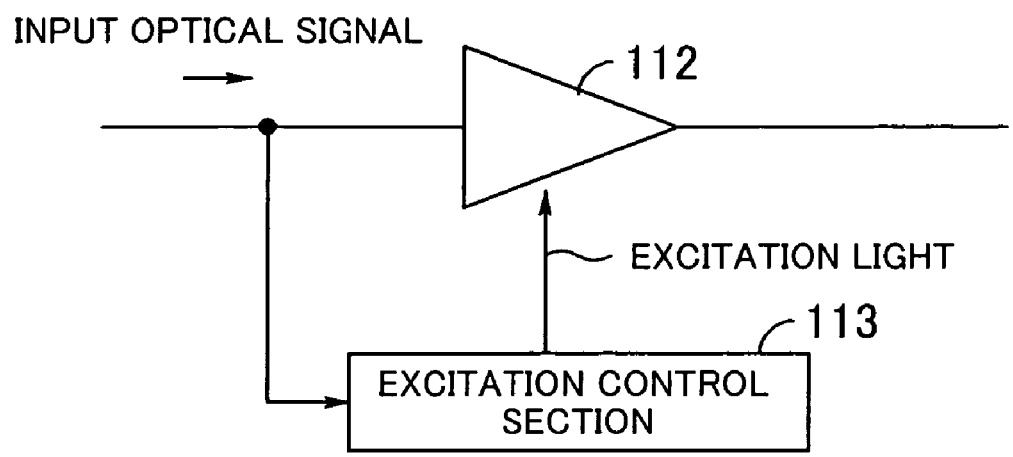

FIGS. 5A and 5B show feedback type and feedforward type control systems. FIG. 5A shows a feedback type control system. FIG. 5B shows a feedforward type control system. In the feedback type control system, an input value and an output value are compared, the difference between them is detected, and the amount of control is adjusted. That is to say, in FIG. 5A, the level of an input optical signal and the level of the optical signal amplified by the optical amplifier 112 are compared by an excitation control section 113 and excitation light power is adjusted so that the gain by the optical amplifier 112 will be constant.

On the other hand, in the feedforward type control system, the amount of control is determined on the basis of control information obtained in advance in anticipation of the result of the control. That is to say, in FIG. 5B, the excitation control section 113 outputs excitation light power on the basis of information regarding the correlation between the level of an input optical signal and excitation light power obtained in advance so that the gain by the optical amplifier 112 will be constant.

Constant-gain control can be performed both by the feedback type control system shown in FIG. 5A and by the feedforward type control system shown in FIG. 5B. With the feedback control shown in FIG. 5A, however, a delay occurs because a line for feeding back the optical signal after the gain control is included. If the level of the input optical signal changes in a period of time shorter than this delay time, the feedback type control system cannot cope with it. As a result, the feedback type control system may be unable to provide output stably. Moreover, if a higher frequency band is used in the system to shorten transient response time like that shown in FIGS. 3 and 4 (to suppress an optical surge caused by a change in the number of wavelengths contained in the input optical signal), various problems will arise. For example, control becomes unstable and the system oscillates.

On the other hand, with the feedforward control shown in FIG. 5B, there is no line for feedback. As a result, there is no possibility of delay or oscillation and this control system can cope rapidly with a change in the level of the input optical signal. Therefore, this control system can suppress an optical surge caused by a change in the number of wavelengths contained in the input optical signal, and perform stable constant-gain control. As described above, the optical amplifier 10 according to the present invention uses the feedforward type control system for driving the excitation light source 11b and compensating for a change in the characteristics of the excitation light source 11b. This improves the quality and reliability of optical amplification control.

Figure 6:
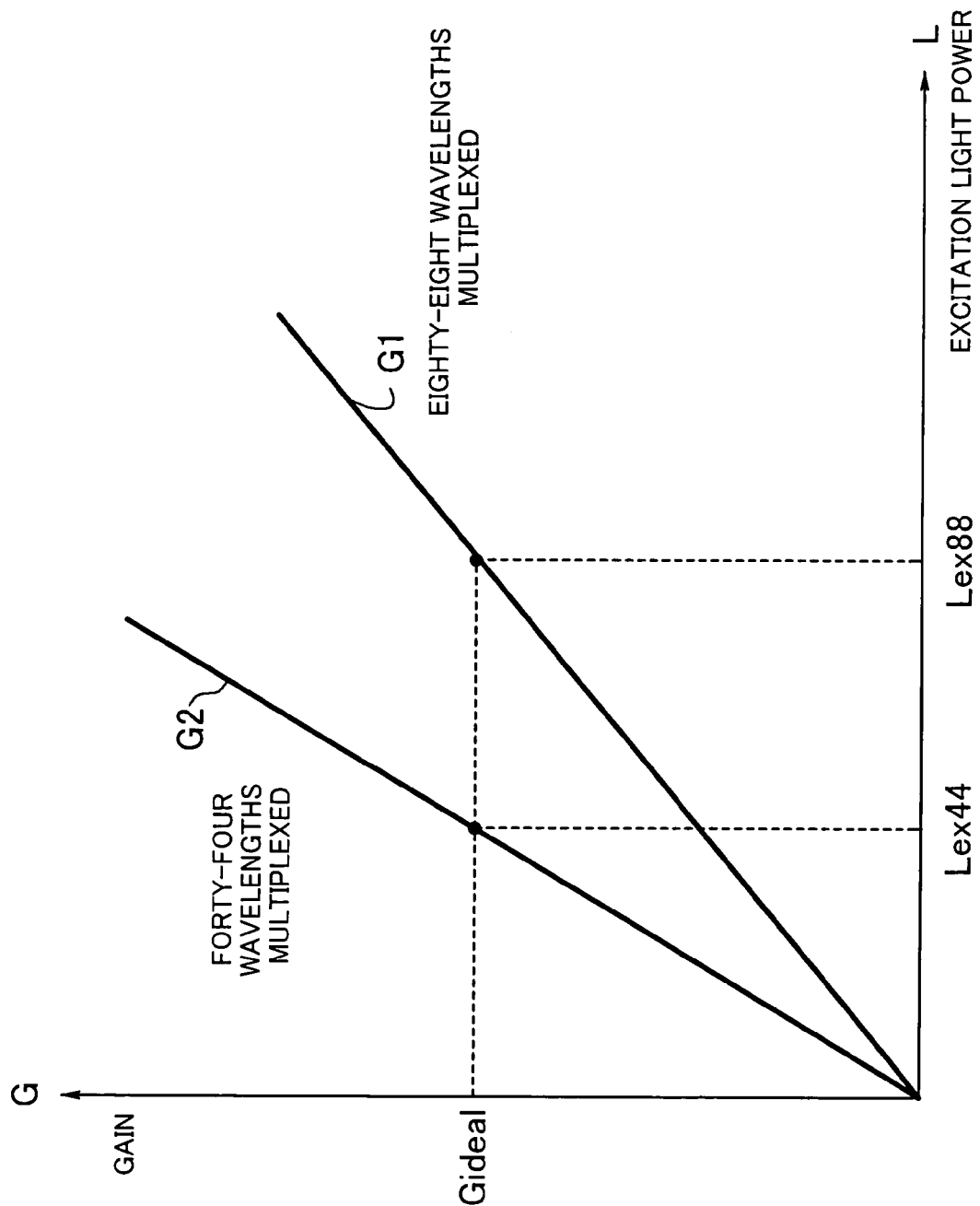
FIG. 6 shows a correlation between a gain and excitation light power.

The operation of the constant-gain control section 12 in the present invention will now be described in detail. FIG. 6 shows correlations between a gain and excitation light power. Ordinate and abscissa axes in FIG. 6 indicate a gain and excitation light power respectively. The gain-excitation light power correlation section 12a manages a correlation at each level of the input optical signal (for each number of wavelengths contained in the input WDM signal) between a target gain to be set and target excitation light power.

It is assumed that the WDM signal which may contain up to eighty-eight wavelengths is inputted. There are eighty-eight level values for the optical signal according to the number of the wavelengths contained therein. The gain-excitation light power correlation section 12a holds excitation light power information according to the level values for making a gain constant. That is to say, the gain-excitation light power correlation section 12a holds eighty-eight pieces of excitation light power information for obtaining one target gain.

In the case of a graph G1 in FIG. 6, the WDM signal contains eighty-eight wavelengths. If a target gain to be set is Gideal, then excitation light power Lex88 must be outputted from the excitation light source 11b to obtain Gideal. In the case of a graph G2 in FIG. 6, the WDM signal contains forty-four wavelengths. Excitation light power Lex44 must be outputted from the excitation light source 11b to obtain Gideal.

As stated above, the gain-excitation light power correlation section 12a manages excitation light power information at each level of the input optical signal for obtaining the target gain Gideal (this value is constant even if there is a change in the level of the input optical signal).

Figure 7:
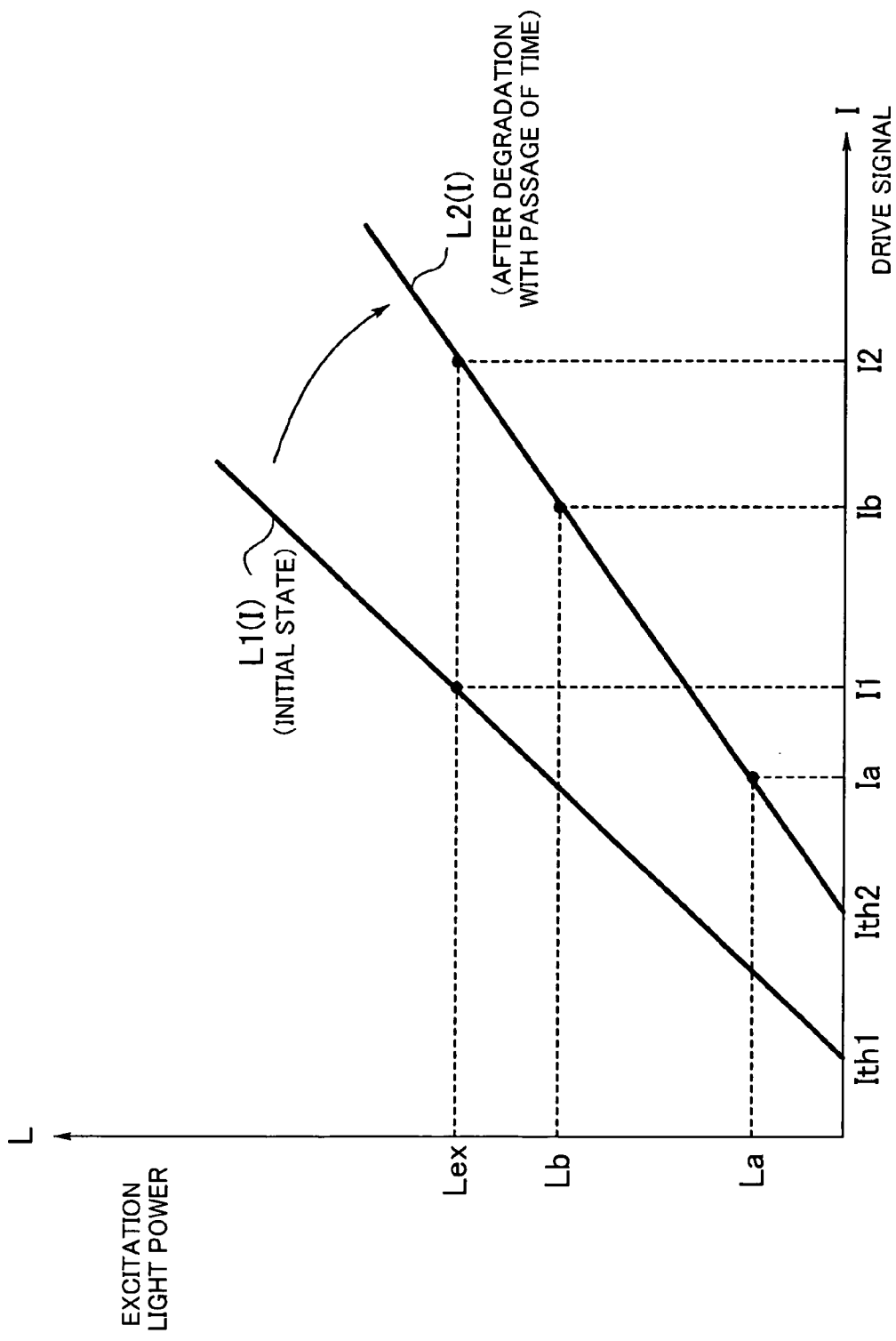
FIG. 7 shows a correlation between a drive signal and excitation light power.

FIG. 7 shows correlations between a drive signal and excitation light power. Ordinate and abscissa in FIG. 7 indicate excitation light power L and a drive signal (current value) I respectively. The drive signal-excitation light power correlation section 12b manages correlations between excitation light power and a drive signal (I-L curves). If excitation light power Lex is sent from the gain-excitation light power correlation section 12a as information, a corresponding drive signal I1 is obtained by the use of a correlation function applied in the initial state.

This information is sent from the drive signal-excitation light power correlation section 12b to the drive signal output section 12c and current corresponding to the drive signal I1 is sent from the drive signal output section 12c to the excitation light source 11b. By performing this series of control processes, the gain can be kept constant even if there is a change in the level of the input optical signal.

The I–L curves shown in FIG. 7 will now be described. It is assumed that the current value of a drive signal is I and that excitation light power corresponding to the current value I is L(I). If a semiconductor laser is used as the excitation light source 11b, the following linear approximate expression (correlation function) will hold between the excitation light power L(I) and the drive signal I.

$$L(I) = \eta(I - Ith) \quad (1)$$

where Ith is an oscillation threshold and $\eta$ is conversion efficiency.

In the excitation light source 11b, both of the oscillation threshold Ith and conversion efficiency $\eta$ in the above expression will change due to, for example, degradation with the passage of time. Therefore, to find out the drive signal from the excitation light power found out by the gain-excitation light power correlation section 12a, a correlation function in which this degradation with the passage of time is taken into consideration must be used.

A correlation function L1(I) applied in the initial state is given by $$L1(I) = \eta 1(I - Ith1) \quad (2)$$

where Ith1 is an oscillation threshold and $\eta 1$ is conversion efficiency.

A correlation function L2(I) applied after degradation with the passage of time is given by $$L2(I) = \eta 2(I - Ith2) \quad (3)$$

where Ith2 is an oscillation threshold and $\eta 2$ is conversion efficiency.

If the excitation light power found out by the gain-excitation light power correlation section 12a is Lex, then the value of the drive signal is I1 at the time of the beginning of operation because the correlation function L1(I) is applied. However, as a result of operation the slope of the I-L curve decreases due to degradation with the passage of time. Accordingly, the drive signal I1 is used at the time of the beginning of operation for obtaining the excitation light power Lex. However, a drive signal I2 must be used after the degradation with the passage of time for obtaining the excitation light power Lex because the correlation function L2(I) is applied. That is to say, if a difference in correlation function is not taken into consideration, the drive signal I1 will still be outputted even after the degradation with the passage of time. As a result, the gain cannot be kept constant.

How to generate a correlation function which changes due to degradation with the passage of time will now be described. The drive signal-excitation light power correlation section 12b changes a correlation function applied in the initial state by regularly measuring excitation light power while varying the current value of a drive signal. It is assumed that the correlation function L2(I) shown in FIG. 7 is generated. The drive signal-excitation light power correlation section 12b first gives the drive signal output section 12c instructions to output a drive signal Ia. The drive signal output section 12c outputs the drive signal Ia to the excitation light source 11b.

At this time the PD 1b detects light emitted from the rear of the excitation light source 11b and sends the photocurrent of the light to the drive signal-excitation light power correlation section 12b. The drive signal-excitation light power correlation section 12b converts this photocurrent into excitation light power and obtains excitation light power La emitted at the time of the drive signal Ia being outputted. Similarly, the drive signal-excitation light power correlation section 12b makes the drive signal output section 12c output a drive signal Ib and obtains excitation light power Lb emitted at this time.

The drive signal-excitation light power correlation section 12b has obtained the two points (Ia, La) and (Ib, Lb) by the above operation, so it can generate the I-L curve of the correlation function L2(I). Therefore, after the beginning of the operation of the optical amplifier 10, the latest correlation function generated in this way should be used for finding out a drive signal corresponding to excitation light power.

For example, if the default correlation function L1(I) has changed to the correlation function L2(I) due to degradation with the passage of time after the beginning of the operation, the target drive signal I2 corresponding to the target excitation light power Lex can be found out by the use of the correlation function L2(I) generated in advance by performing automatic measurement.

As a result, even if degradation of the excitation light source 11b occurs with the passage of time, a drive signal for making the excitation light source 11b output desired excitation light power can be obtained according to the state of the excitation light source 11b. This enables degradation compensation. Moreover, information indicative of a drive signal-excitation light power correlation is obtained from the excitation light source 11b degradation of which actually occurs with the passage of time. Therefore, compared with the conventional technique in which data is updated by providing a set value from the outside, degradation compensation can be performed with great accuracy.

Figure 8:
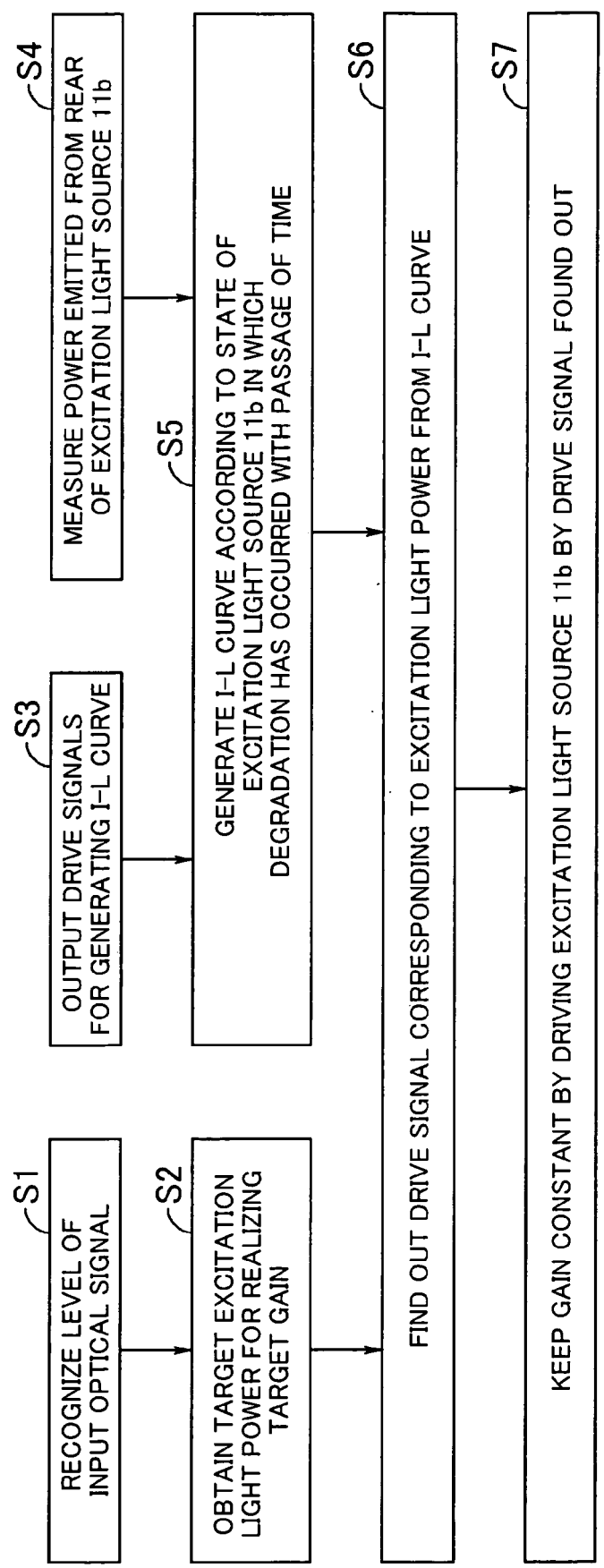
FIG. 8 shows the flow of operation for constant-gain control.

FIG. 8 shows the flow of operation for constant-gain control.

[S1] The gain-excitation light power correlation section 12a recognizes the level of an input optical signal by photocurrent from the PD1a. (To be concrete, the photocurrent is converted further into voltage and is converted into a logarithm with a log amplifier. For example, if input voltage is VIN and output voltage is VOUT, then VOUT=k×log VIN.)

[S2] The gain-excitation light power correlation section 12a obtains target excitation light power for realizing a target gain on the basis of the level it recognized.

[S3] The drive signal-excitation light power correlation section 12b gives the drive signal output section 12c instructions to output drive signals for generating an I-L curve (correlation function). The drive signal output section 12c outputs the corresponding drive signals to the excitation light source 11b.

[S4] The drive signal-excitation light power correlation section 12b recognizes power emitted from the rear of the excitation light source 11b by photocurrent from the PD1b.

[S5] The drive signal-excitation light power correlation section 12b generates an I–L curve according to altered characteristics of the excitation light source 11b (according to the state of the excitation light source 11b in which a degradation occurs with the passage of time).

[S6] The drive signal-excitation light power correlation section 12b finds out the value of a target drive signal corresponding to the target excitation light power found out by the gain-excitation light power correlation section 12a from the latest I-L curve.

[S7] The drive signal-excitation light power correlation section 12b gives the drive signal output section 12c instructions to output the drive signal it found out in step S6. The drive signal output section 12c outputs the corresponding drive signal to the excitation light source 11b. As a result, even if there is a change in the level of the input optical signal, a gain can be kept constant. In addition, even if degradation of the excitation light source 11b occurs with the passage of time, degradation compensation can be performed.

The degradation alarm giving section 13 will now be described. As shown in FIG. 7, if degradation of the excitation light source 11b occurs with the passage of time, the slope of the I-L curve decreases. Therefore, to make the excitation light source 11b output desired excitation light power, a drive signal having a greater value will be required.

However, there is an upper limit to a drive signal outputted to the excitation light source 11b, so usable I-L curves are limited. That is to say, only I-L curves the slopes of which do not exceed the upper limit of a drive signal can be used. (Actually, the drive signal output section 12c performs an APC limitation process so that a drive signal will not exceed the upper limit. Therefore, a drive signal which is found out from an I-L curve and which exceeds the upper limit will not be outputted in its original condition.)

If information indicative of the slope of an I-L curve (correlation function) obtained from the drive signal-excitation light power correlation section 12b exceeds a preset value, then the degradation alarm giving section 13 gives the alarm to the person in charge of maintenance because the excitation light source 11b is in a fairly advanced stage of degradation.

Figure 9:
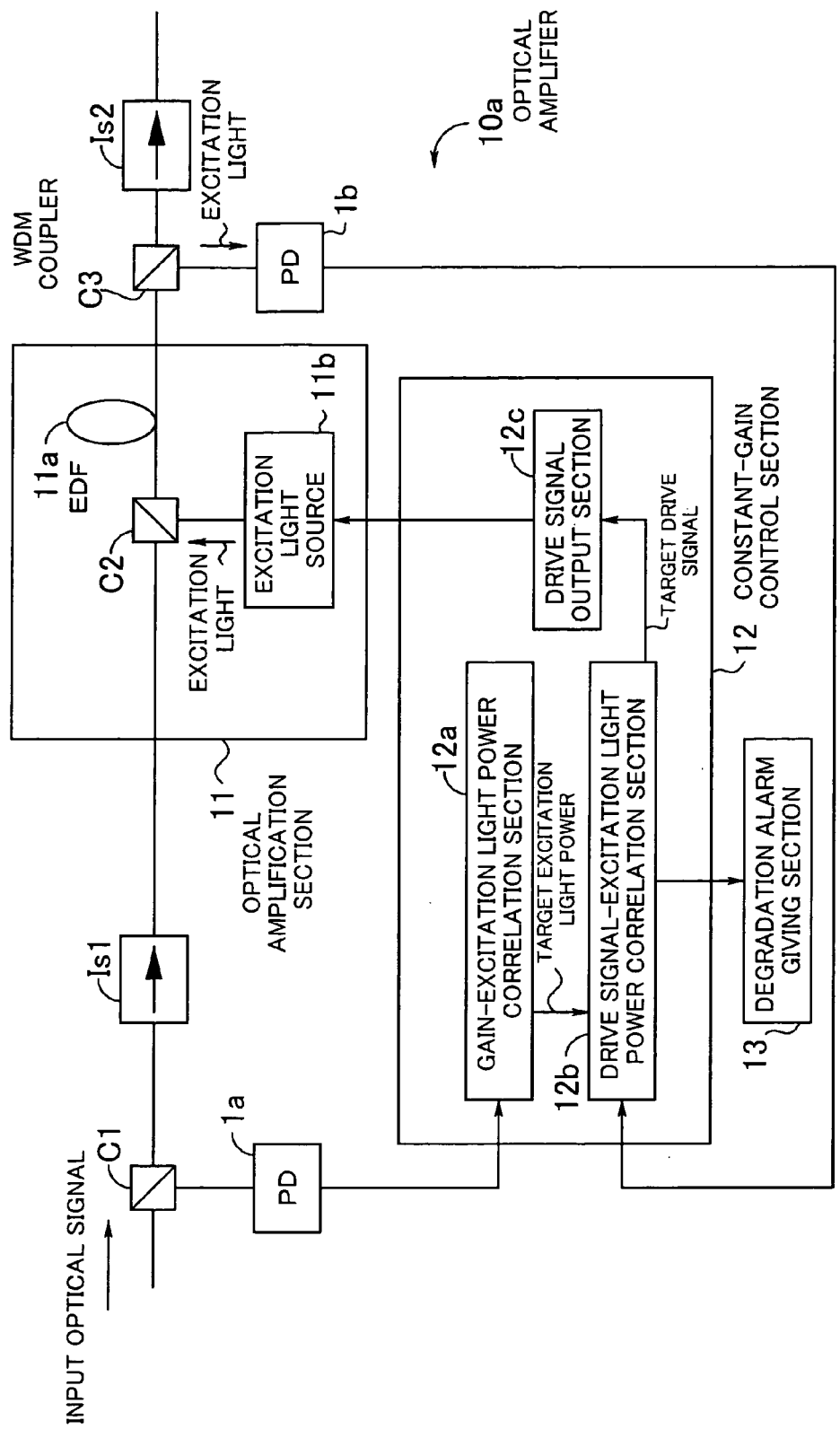
FIG. 9 shows the structure of an optical amplifier.

A modification of the structure of the optical amplifier 10 will now be described. FIG. 9 shows the structure of an optical amplifier. In the optical amplifier 10 shown in FIG. 1, light emitted from the rear of the excitation light source 11b is received by the PD 1b. In an optical amplifier 10a shown in FIG. 9, however, excitation light dropped by a WDM coupler C3 located between an amplification output section of an EDF 11a and the input side of an isolator Is2 is received by a PD 1b. The rest of the structure of the optical amplifier 10a is the same as that of the optical amplifier 10, so descriptions of it will be omitted.

Figure 10:
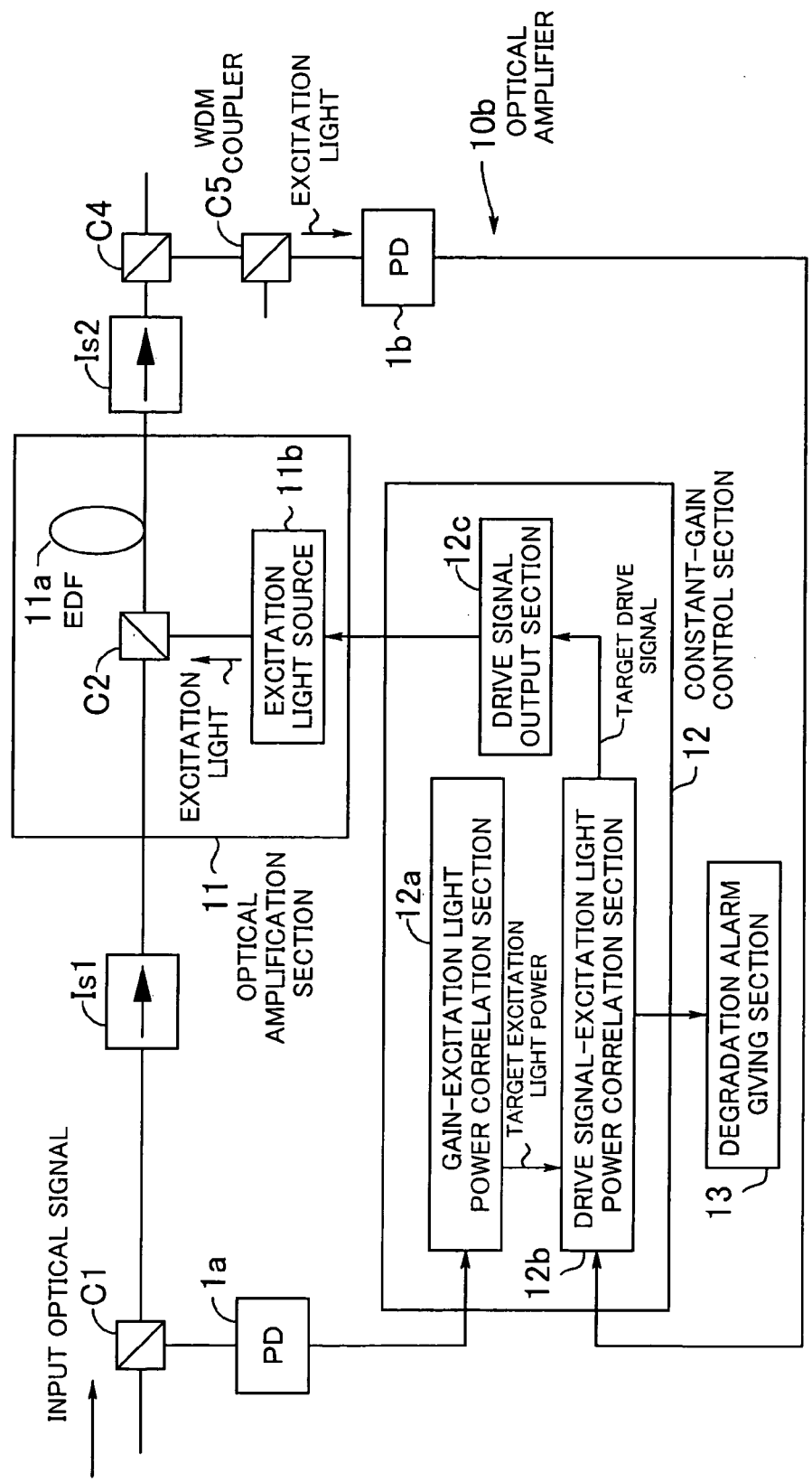
FIG. 10 shows the structure of an optical amplifier.
Figure 11:
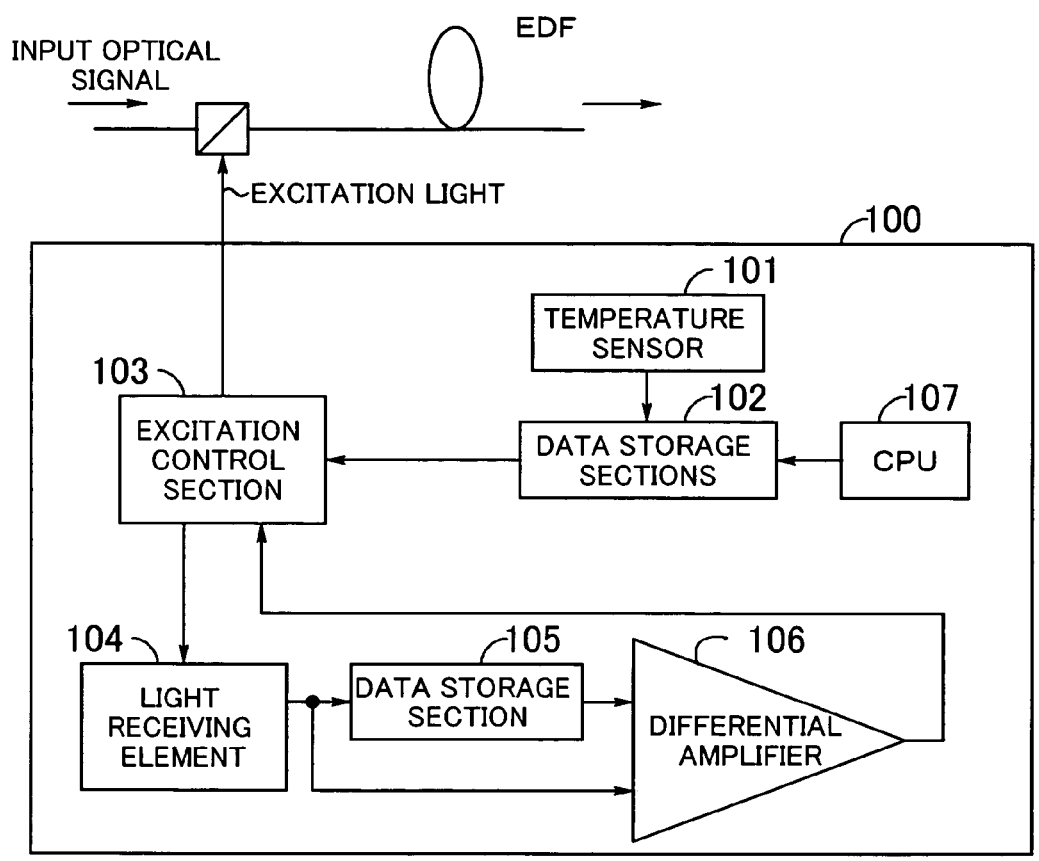
FIG. 11 is a block diagram showing the rough structure of a conventional apparatus.

FIG. 10 shows the structure of an optical amplifier. An optical amplifier 10b shown in FIG. 10 differs from the optical amplifier 10 shown in FIG. 1 in that it includes a demultiplexer C4 connected to an output section of an isolator Is2 and a WDM coupler C5 connected to one drop output section of the demultiplexer C4. An optical signal and excitation light are dropped to the WDM coupler C5 by the demultiplexer C4. Only the dropped excitation light is dropped to a PD 1b by the WDM coupler C5 and is received by the PD 1b. The rest of the structure of the optical amplifier 10b is the same as that of the optical amplifier 10, so descriptions of it will be omitted.

As has been described in the foregoing, with the optical amplifier according to the present invention, target excitation light power to be set according to a change in the level of an input optical signal is found out on the basis of a correlation between a gain and excitation light power to obtain a target gain, a target drive signal for making a excitation light source emit the target excitation light power is found out on the basis of a correlation between a drive signal for driving the excitation light source and excitation light power, and constant-gain control is exercised over an optical amplification section by a feedforward control system. This enables the driving of the excitation light source according to a change in the level of an input optical signal and compensation for a change in the characteristics of the excitation light source. Therefore, transmission quality and reliability can be improved.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. An optical amplifier for amplifying an optical signal, the amplifier comprising:

an optical amplification section including an amplification medium doped with an active substance for optical amplification and an excitation light source which emits excitation light that is provided to the amplification medium so that optical amplification occurs in the amplification medium; and a constant-gain control section finding out target excitation light power to be set according to a change in the level of an input optical signal on the basis of a correlation between a gain and excitation light power to obtain a target gain, finding out a target drive signal for making the excitation light source emit the target excitation light power on the basis of a correlation function between a drive signal for driving the excitation light source and excitation light power, and exercising constant-gain control over the optical amplification section by a feedforward control system, wherein the constant-gain control section generates the correlation function according to a change in characteristics of the excitation light source which changes due to degradation over time, between a drive signal and excitation light power by varying the drive signal and by regularly measuring excitation light power, and finds out a target drive signal from the target excitation light power on the basis of the correlation function.

2. The optical amplifier according to claim 1, wherein the input optical signal includes a plurality a different wavelengths that are wavelength division multiplexed together, and the constant-gain control section has a correlation between gain and excitation light power for different numbers of wavelengths being included in the input optical signal, and, to obtain the target gain, the constant-gain control section finds out, from the correlation between gain and excitation light power, target excitation light power corresponding to a change in the level of the input optical signal caused by a change in the number of wavelengths actually included in the input optical signal.

3. The optical amplifier according to claim 1, further comprising a degradation alarm giving section for recognizing a degree of degradation of the excitation light source from a correlation slope of the correlation function and for performing alarm giving control.

4. A gain control method comprising:

recognizing a level of an input optical signal input to an optical amplification medium that is provided with excitation light to cause the input optical signal to be optically amplified as the input optical signal travels through the optical amplification medium, the excitation light being provided by an excitation light source in accordance with drive signals for driving the excitation light source;

obtaining target excitation light power for realizing a target gain on the basis of the recognized level;

generating a correlation function according to a change in characteristics of the excitation light source which changes due to degradation over time, between a drive signal and excitation light cower by varying the drive signal and by regularly measuring excitation light power;

finding out a target drive signal corresponding to the target excitation light power on the basis of the generated correlation function; and exercising constant-gain control with a feedforward control system by driving the excitation light source by the target drive signal.

5. The gain control method according to claim 4, further comprising:

recognizing a degree of degradation of the excitation light source from a correlation slope of the correlation function and performing alarm giving control.

6. A gain control apparatus comprising:

means for recognizing a level of an input optical signal input to an optical amplification medium that is provided with excitation light to cause the input optical signal to be optically amplified as the input optical signal travels through the optical amplification medium, the excitation light being provided by an excitation light source in accordance with drive signals for driving the excitation light source;

means for obtaining target excitation light power for realizing a target gain on the basis of the recognized level;

means for generating a correlation function according to a change in characteristics of the excitation light source which changes due to degradation over time, between a drive signal and excitation light power by varying the drive signal and by regularly measuring excitation light power;

means for finding out a target drive signal corresponding to the target excitation light power on the basis of the generated correlation function; and means for exercising constant-gain control with a feedforward control system by driving the excitation light source by the target drive signal.

* * * * *

UNITED STATES PATENT AND TRADEMARK OFFICE
CERTIFICATE OF CORRECTION

| | |
|---|---|
| PATENT NO. | : 7,145,717 B2 |
| APPLICATION NO. | : 10/793273 |
| DATED | : December 5, 2006 |
| INVENTOR(S) | : Masao Nakata et al. |

It is certified that error appears in the above-identified patent and that said Letters Patent is hereby corrected as shown below:

Column 11, line 38, change "cower" to --power--.

Signed and Sealed this

Twenty-seventh Day of February, 2007

JON W. DUDAS
*Director of the United States Patent and Trademark Office*